United States Patent
Wang et al.

(10) Patent No.: US 9,919,608 B2
(45) Date of Patent: Mar. 20, 2018

(54) POWER-MODULE ASSEMBLY FOR A VEHICLE

(71) Applicant: Ford Global Technologies, LLC, Dearborn, MI (US)

(72) Inventors: Tienli Wang, Troy, MI (US); Guangyin Lei, Dearborn Heights, MI (US); Edward Chan-Jiun Jih, Troy, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 238 days.

(21) Appl. No.: 14/687,404

(22) Filed: Apr. 15, 2015

(65) Prior Publication Data

US 2016/0308480 A1    Oct. 20, 2016

(51) Int. Cl.
| | | |
|---|---|---|
| H02K 41/00 | (2006.01) |
| H02P 1/00 | (2006.01) |
| H02P 3/00 | (2006.01) |
| H02P 5/00 | (2016.01) |
| B60L 11/18 | (2006.01) |
| H05K 7/20 | (2006.01) |
| H02M 7/00 | (2006.01) |

(52) U.S. Cl.
CPC ...... *B60L 11/1803* (2013.01); *H05K 7/20927* (2013.01); *H02M 7/003* (2013.01)

(58) Field of Classification Search
CPC ......................... H05K 7/20927; H02M 7/003
USPC .......................................... 318/135; 429/120
See application file for complete search history.

(56) References Cited

U.S. PATENT DOCUMENTS

| | | | |
|---|---|---|---|
| 7,835,151 B2 | 11/2010 | Olesen | |
| 8,248,809 B2 | 8/2012 | Miller et al. | |
| 8,609,268 B2 | 12/2013 | Fuhr et al. | |
| 2007/0087266 A1* | 4/2007 | Bourke | H01M 2/0242 |
| | | | 429/159 |
| 2008/0251909 A1 | 10/2008 | Tokuyama et al. | |
| 2008/0280178 A1* | 11/2008 | Spink | H01M 8/0236 |
| | | | 429/514 |
| 2011/0027621 A1 | 2/2011 | Deane et al. | |
| 2012/0244404 A1 | 9/2012 | Obasih et al. | |
| 2013/0170141 A1* | 7/2013 | Hankamaki | H05K 7/20218 |
| | | | 361/699 |
| 2014/0178736 A1* | 6/2014 | Gandhi | B60L 3/0046 |
| | | | 429/120 |
| 2014/0234742 A1* | 8/2014 | Terada | H01M 8/24 |
| | | | 429/455 |
| 2015/0093670 A1* | 4/2015 | Kobayashi | H01M 8/04067 |
| | | | 429/434 |

OTHER PUBLICATIONS

Products for Electric and Hybrid Vehicles, Mar. 25, 2015, 13 pgs.

* cited by examiner

*Primary Examiner* — Erick Glass
(74) *Attorney, Agent, or Firm* — David Kelley; Brooks Kushman, P.C.

(57) ABSTRACT

A power-module assembly includes a plurality of power modules that each have a power stage with opposing major sides and minor sides surrounded by a frame. The frame extends past the major sides and cooperates with the major sides to define pockets on each side of the power module. The modules are arranged in a stack such that pockets adjacent to each other cooperate to form coolant chambers interleaved with the modules.

18 Claims, 5 Drawing Sheets

POWER-MODULE ASSEMBLY FOR A VEHICLE

TECHNICAL FIELD

The present disclosure relates to power-module assemblies for automotive vehicles.

BACKGROUND

Vehicles such as battery-electric vehicles (BEVs), plug-in hybrid electric vehicles (PHEVs) and full hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power inverter includes a plurality of power modules that each have a power stage with opposing major sides and minor sides surrounded by a frame. The frame extends past the major sides and cooperates with the major sides to define pockets on each side of the power module. The modules are arranged in a stack such that pockets adjacent to each other cooperate to form coolant chambers interleaved with the modules.

According to another embodiment, a power-module assembly includes a plurality of power modules that each have opposing major sides. Each of the opposing sides define a pocket recessed therein. The modules are arranged in a stack such that pockets adjacent to each other cooperate to form coolant chambers interleaved with the modules.

According to yet another embodiment, a vehicle includes a traction battery electrically connected to at least one electric machine and wheels configured to be driven by the at least one electric machine. The vehicle further includes a power inverter electrically connected between the battery and the at least one electric machine. The power inverter includes a plurality of power modules that each having a power stage with opposing major sides and minor sides surrounded by a frame. The frame extends past the major sides and cooperates with the major sides to define pockets on each side of the power module. The modules are arranged in a stack such that pockets adjacent to each other cooperate to form coolant chambers interleaved with the modules.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
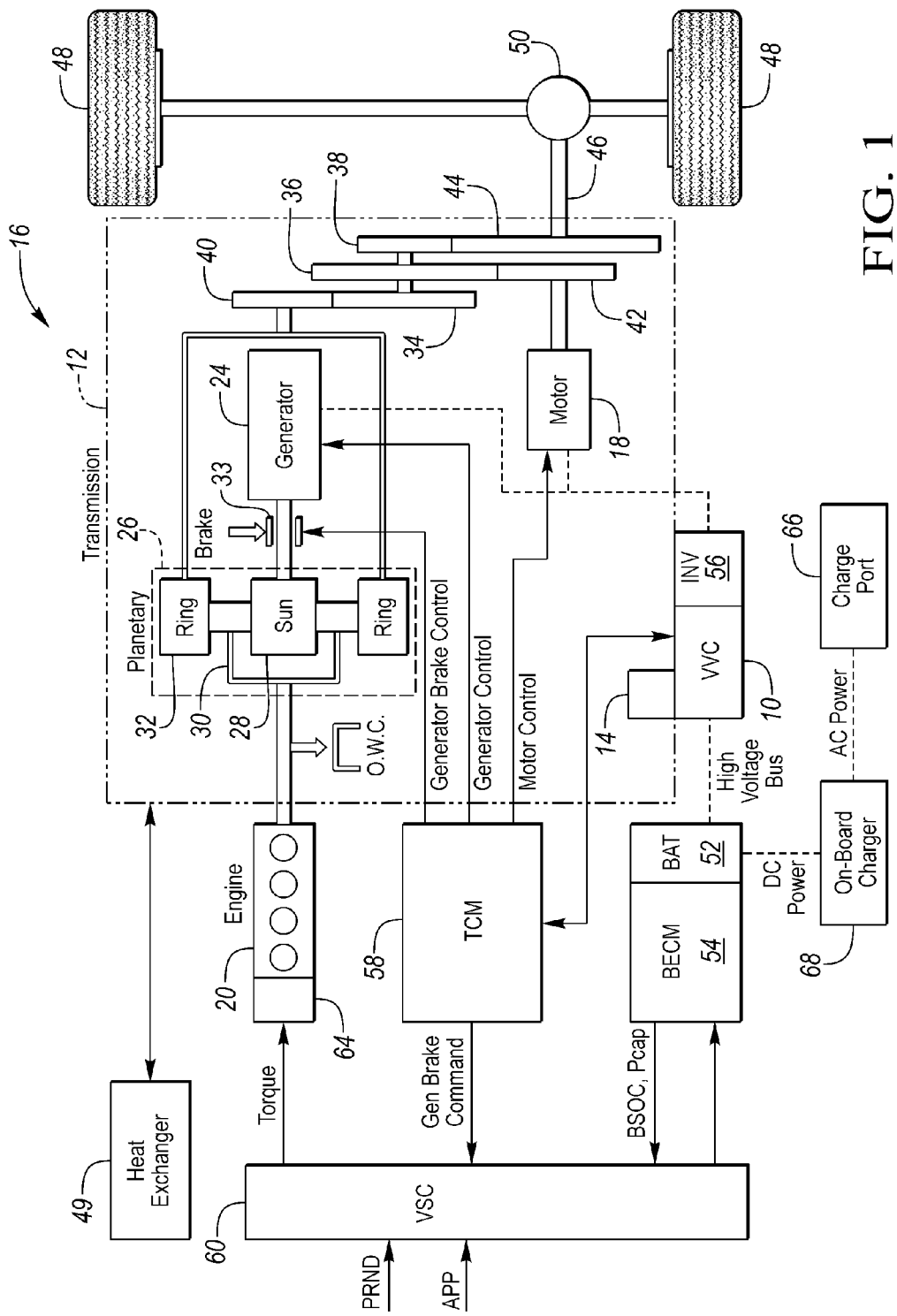
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an AC electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 includes a planetary gear unit 26, which includes a sun gear 28, a planet carrier 30 and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 includes a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48. The transmission also includes a heat exchanger or automatic transmission fluid cooler 49 for cooling the transmission fluid.

The vehicle 16 includes an energy storage device, such as a traction battery 52 for storing electrical energy. The battery 52 is a high voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one inverter associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
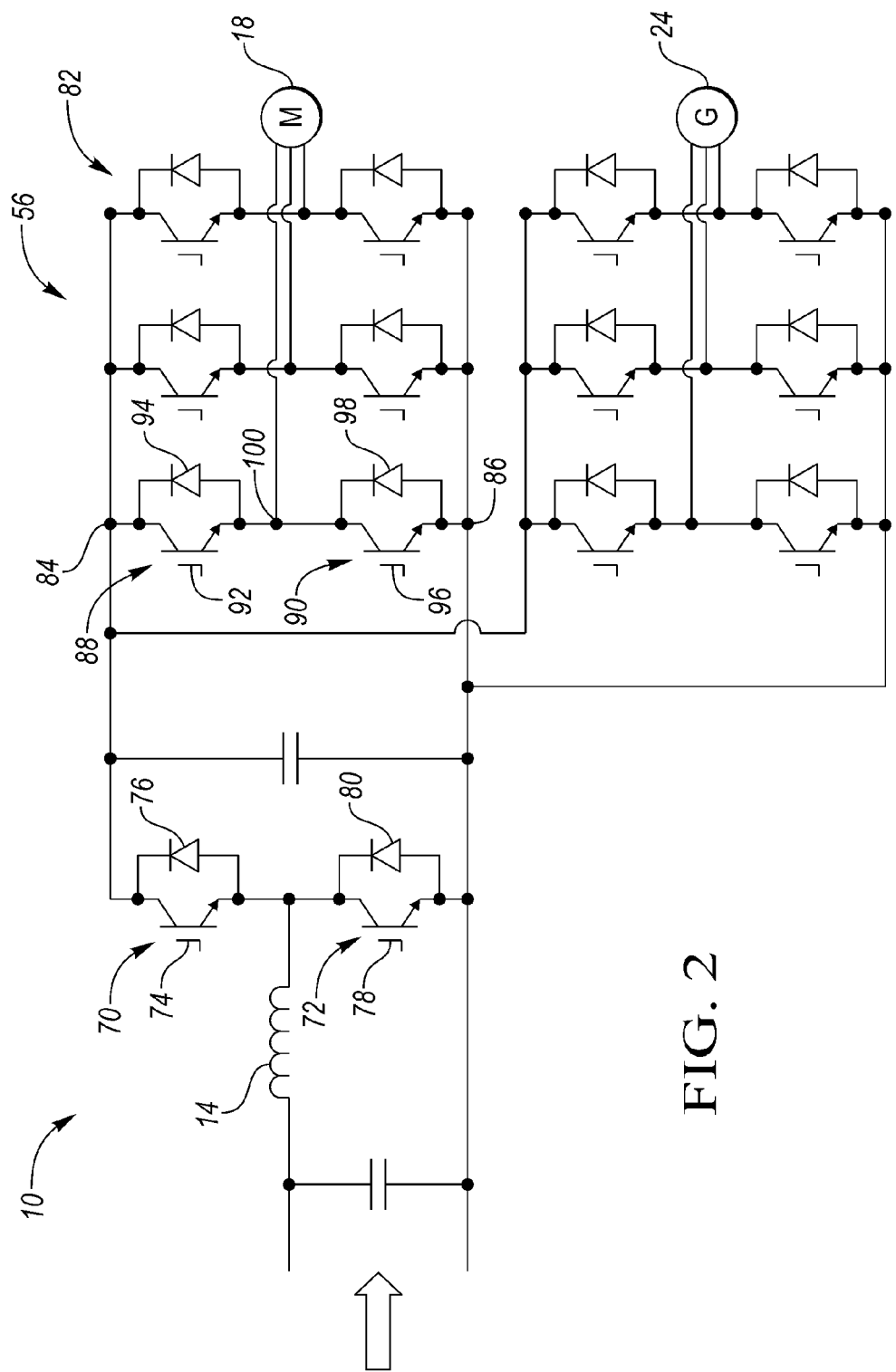
FIG. 2 is a schematic diagram of a variable voltage converter and a power inverter.

Referring to FIG. 2, an electrical schematic of the VVC 10 and the inverter 56 is shown. The VVC 10 may include a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations (e.g., more than two switches).

The inverter 56 includes a plurality of half-bridges 82 that are stacked in an assembly. Each of the half-bridges may be packaged as a power stage. In the illustrated embodiment, the inverter 56 includes six half-bridges, three for the motor 18 and three for the generator 24. Each of the half bridges 82 includes a positive DC lead 84 that is coupled to a positive DC node from the battery and a negative DC lead 86 that is coupled to a negative DC node from the battery. Each of the half bridges 82 also include a first switching unit 88 and a second switching unit 90. The first switching unit 88 includes a first transistor 92 connected in parallel to a first diode 94. The second switching unit 90 includes a second transistor 96 connected in parallel to a second diode 98. The first and second transistors 92, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24. In the illustrated example, three of the AC leads 100 are electrically connected to the motor 18 and the other three AC leads 100 are electrically connected to the generator 24.

Referring to FIGS. 3 to 6, the power inverter 56 may include a power-module assembly 57, a capacitor module (not shown) and a gate drive board (not shown). The power-module assembly 57 includes a plurality of power modules 122 arranged in a stack. The power-module assembly 57 includes a first power module 124 defining one end of the stack and a last power module 126 defining the other end of the stack. A first endplate 128 is disposed against the first module 124, and a second endplate 130 is disposed against the last module 126. The endplates cooperate to sandwich the stack and may provide compression to help hold the stack together.

Each of the power modules 122 includes a frame 132 having opposing major sides 134, 136 and minor sides 138 extending therebetween. In the illustrated embodiment, the frame 132 is a hollow rectangular body including a left side 140, a right side 142, a top 144, and a bottom 146 that all cooperate to define an exterior surface 150, an interior surface 148, a front surface 152, and a back surface 154. The frame 132 may have a different shape in other embodiments. The interior surface 148 defines an enclosure for receiving a power stage 82. The power stage 82 may include semiconductor devices as is shown in FIG. 2.

The power stage 82 includes opposing major sides 158 and a plurality of minor sides 160. The power stage 82 is received within the enclosure and is surrounded by the frame 132 on at least some of the minor sides 160. The power stage 82 includes a positive DC power terminal 162 and a negative DC power terminal 164 that each extend through one or more holes defined in the right side 142. Each of the DC terminals 164 may be connected to corresponding terminals of the capacitor module. An AC power terminal 166 of the power stage 82 extends through a hole defined in the bottom 146. The AC power terminals 166 are electrically connected to the electric machines. First and second signal pins 168, 170 of the power stage 82 extend through one or more holes defined in the left side 140. The signal pins 168, 170 may be electrically connected to the gate drive board. The location of the terminals and signal pins may vary by embodiment and are not limited to the configuration shown. A first plate 172 is disposed against one of the major sides 158 of the power stage 82, and a second plate 174 is disposed against the other major side of the power stage 82. The first and second plates 172, 174 are arranged with the outer panel side 176 exposed and with at least some of the edges 178 engaging the interior surface 148 of the frame 132. The first and second plates 172, 174 may be metallic, plastic, composite or a combination thereof. The semiconductor devices of the power stage 82 may be filled with an epoxy 156 or other filler to electrically isolate the power stage from the plates and other components. Note: the epoxy is not cross-hatched for clarity.

The minor sides 138 of the frame 132 are thick enough to extend past the outer panel sides 176 of the plates 172, 174 in the longitudinal direction of the stack. The extended region of the frame 132 and the outer panel side 176 of each plate define a pair of pockets 180 recessed into the major sides of the power module 122. Each of the power modules 122 also includes an opening 184 defined between the frame 132 and the power stage 82. A divider 167 may be disposed within the opening 184.

Figure 3:
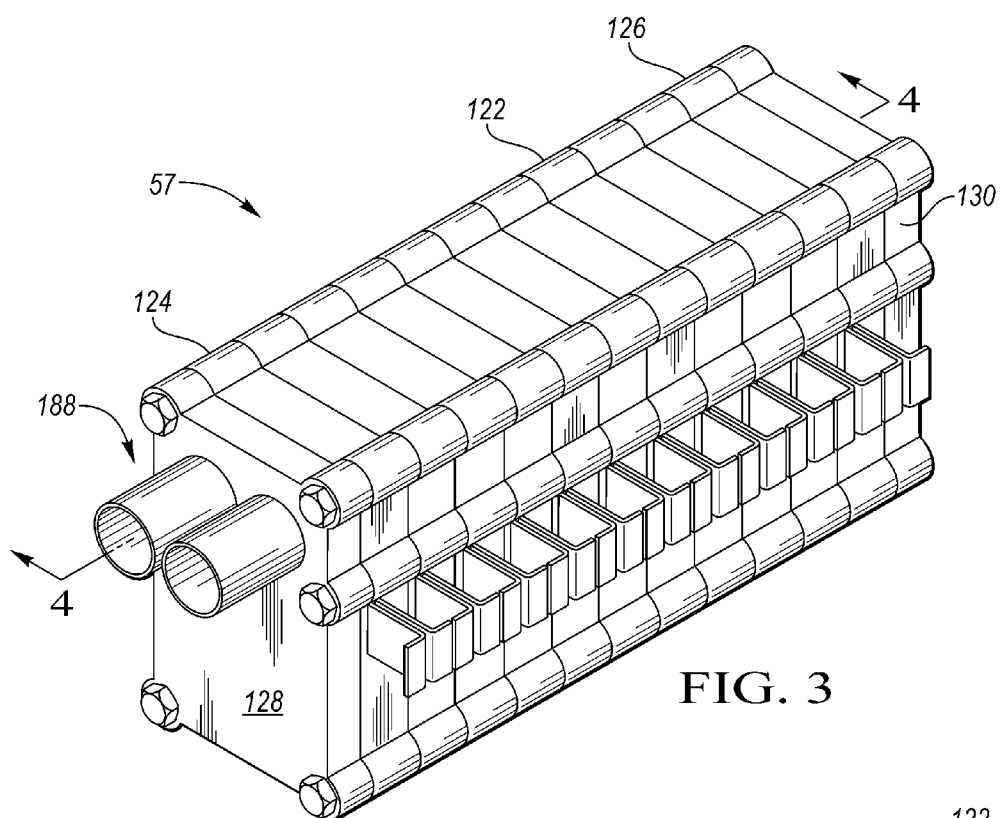
FIG. 3 is a perspective view of a power-module assembly.
Figure 4:
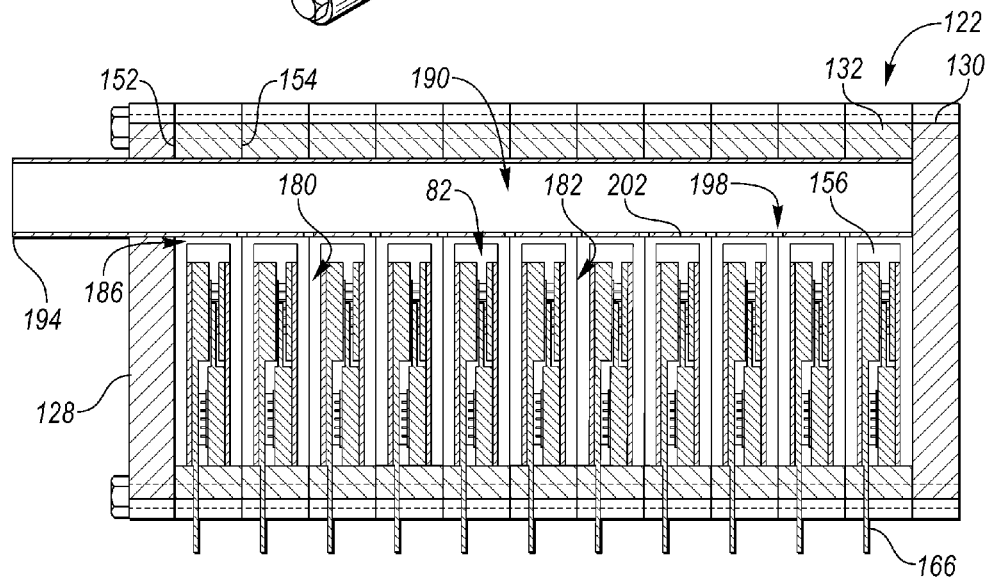
FIG. 4 is a side view, in cross-section, of the assembly of FIG. 3 along cut line 4-4.

As is best shown in FIGS. 3 and 4, the individual power modules 122 are arranged in a stack with the front and back surfaces 152, 154 of adjacent frames 132 being disposed against each other. When stacked, the pockets 180 of adjacent power modules 122 cooperate defining coolant chambers 182 interleaved with the modules 122. The endplates and the power modules may also cooperate to define some of the coolant chambers 182. For example, the first endplate 128 cooperates with the first module 124 to define an outer coolant chamber, and the second endplate 130 cooperates with last module 126 to define another outer coolant chamber. The outer coolant chambers may have a smaller volume than the interior coolant chambers, or the endplates may have a recessed area to provide outer coolant chambers having a same or similar volume as the interior coolant chambers. Alternatively, the outer coolant chambers may be omitted. For example, each of the endplates 128, 130 may include a protruding face that is received within the outer pocket of the first and last modules 124, 126 to fill the pocket. Each of the coolant chambers 182 may be bounded on five sides and may have an open top side. Each of the cooling chambers 182 may include channeling or other features to guide fluid circulating within the chamber.

Figure 5:
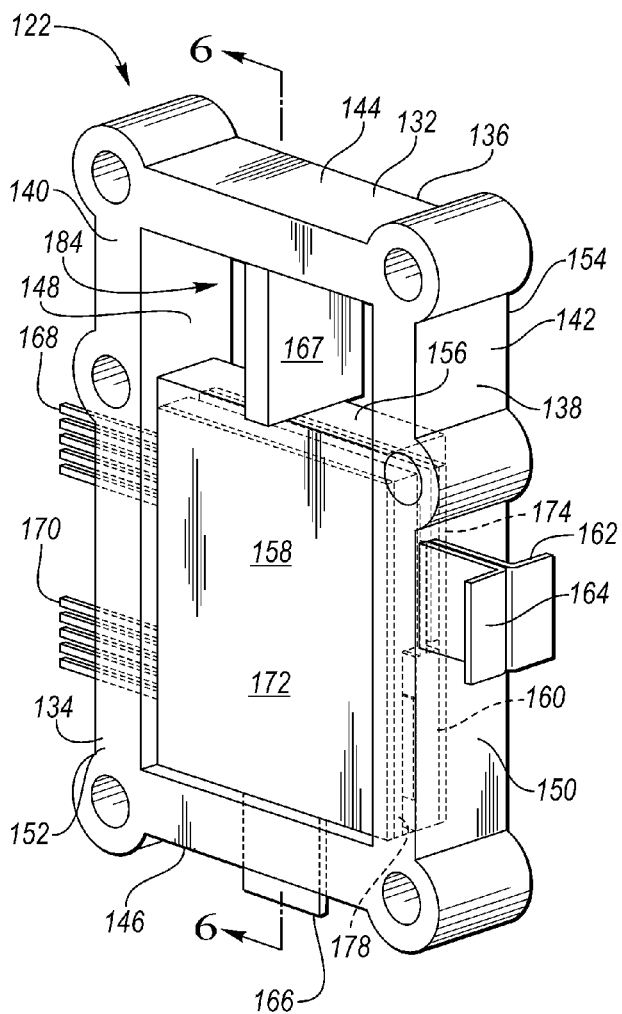
FIG. 5 is a perspective view of one of the modules of the assembly of FIG. 3.
Figure 6:
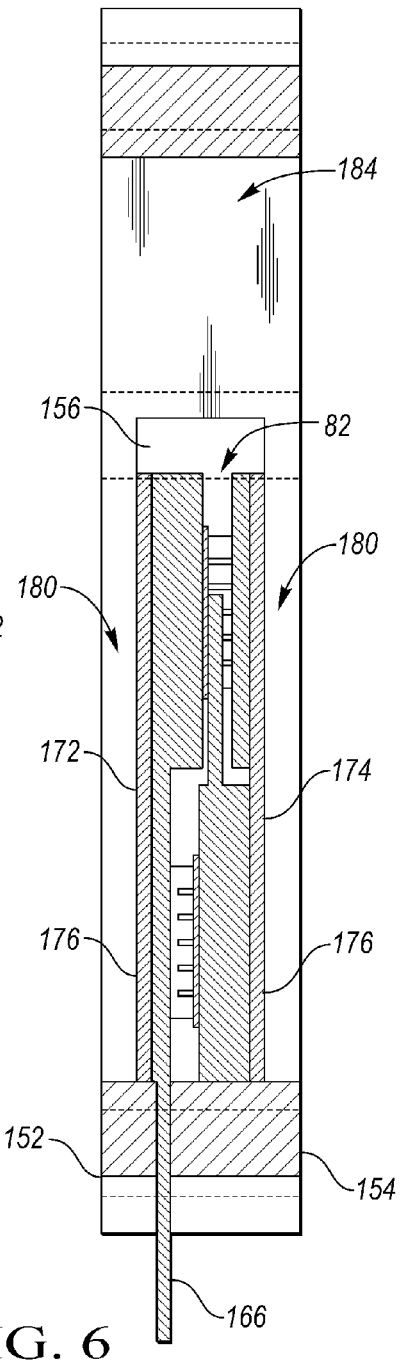
FIG. 6 is a side view, in cross-section, of the module of FIG. 5 along cut line 6-6.
Figure 7:
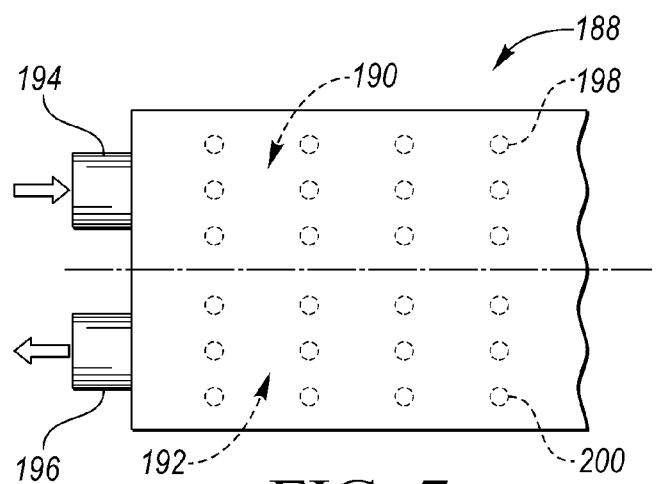
FIG. 7 is a top view of a manifold of the assembly of FIG. 3.

Referring to FIGS. 4, 5 and 7, the openings 184 in each of the modules 122 cooperate forming a cavity 186 that extends along a length of the stack. The open top side of each of the coolant chambers 182 opens into the cavity 186. A manifold 188 is received within the cavity 186 and extends along a length of the stack. The manifold 188 may include a supply chamber 190 and a return chamber 192. The chambers may be on opposite sides of the divider 167 In the illustrated embodiment, the supply chamber and the return chamber are positioned side-by-side, however other configurations are contemplated. The supply chamber 190 includes a port 194 that connects with a supply line, and the return chamber 192 includes a port 196 that connects with a return line. The supply and return lines form part of a larger thermal management system that may include pumps, radiators, other lines, valves, and other components. A bottom surface 202 of the manifold 188 is disposed over the open top side of each of the coolant chambers 182. The bottom surface 202 of the manifold 188 may act as a ceiling for the coolant chambers 182. The bottom surface 202 of the supply chamber 190 may include a plurality of inlets 198 placing the supply chamber 190 in fluid communication with each of the coolant chambers 182. The bottom surface of the return chamber 192 may include a plurality of outlets 200 placing the return chamber in fluid communication with each of the coolant chambers 182. During operation, pressurized coolant in the supply chamber 190 is circulated into each of the coolant chambers 182 to cool the power modules 122. The coolant exits from coolant chambers 182 into the return chamber 192 via the outlets 200. The channeling (if included) within each of the coolant chambers 182 helps guide fluid between the inlets 198 and the outlets 200. The dividers 167 help prevent coolant flowing directly from an inlet 198 to an outlet 200 without flowing through the coolant chambers 182.

The coolant chambers 182 are connected to the manifolds such the chambers are arranged in parallel flow paths. The parallel flow path arrangement provides a more uniform temperature gradient along the length of the stack because the coolant within the supply chamber 190 is relatively uniform. Coolant chambers arranged in series may have a relatively large temperature gradient, where coolant at the exit end of the stack is much hotter than at the entrance end of the stack.

Figure 8:
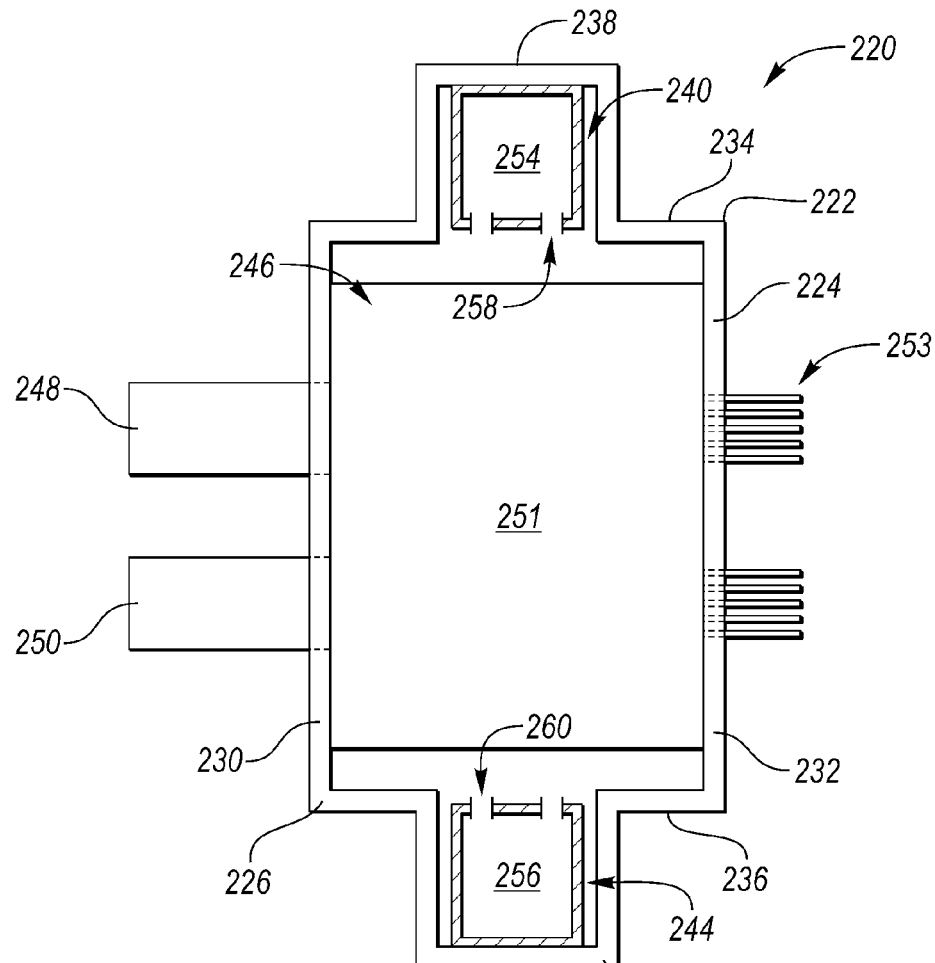
FIG. 8 is a front view of a module.

Referring to FIG. 8, a cross-sectional view of another power inverter 220 is illustrated. The power inverter 220 includes a plurality of power modules 222 having a frame 224 with a front face 226 and a back face (not visible). In the illustrated embodiment, the frame 224 also includes a left side 230, a right side 232, a top 234 and a bottom 236. An upper protruding portion 238 extends upwardly from the top 234 and defines a cavity 240. A lower protruding portion 242 extends downwardly from the bottom 236 and defines a cavity 244.

A power stage 246 is received within the frame 224. The power stage includes major sides not covered by the frame and minor sides that are surrounded by an interior surface of the frame 224. The power stage 246 includes a pair of positive and negative DC terminals 248 extending through the left side 230, and an AC terminal 250 extending through the left side 230. The pair of positive and negative DC terminals 248 are stacked next to each other and only one of them is visible in the figure. Signal pins 253 of the power stage 246 extend through the right side 232. The terminals and signal pins may be placed in different locations in other embodiments. Plates 251 are disposed on each of the major sides of the power stage 246. The frame 224 is sized to extend past the plates forming a pocket. Adjacent pockets cooperate to form coolant chambers as described above. An inlet manifold 254 is received within the upper cavity 240 and an outlet manifold 256 is received within the lower cavity 244. The manifold may be slightly smaller than the cavity (as shown) or may be substantially the same size. The inlet and outlet manifolds are in fluid communication with each of the coolant chambers via inlets 258 and outlets 260. During operation of the cooling system, fluid flows from the inlet manifold 254 across the power stage 246, and out via the outlet manifold 256 to cool the power stage 246. As illustrated, the upper and lower protruding portions and the upper and lower manifolds are centered on the centerline of the frame 224. But, in other embodiments, the protruding portions and manifolds may be offset to the left or to the right of the centerline.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated.

While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power inverter comprising:
power modules each including a power stage having a switching unit and opposing major sides and minor sides surrounded by a frame, wherein the frame extends past the major sides and cooperates with the major sides to define pockets on each side of the power module, and wherein the modules are arranged in a stack such that pockets adjacent to each other cooperate to form coolant chambers interleaved with the modules.

2. The power inverter of claim 1 wherein the plurality of power modules further includes a first module defining one end of the stack and a last module defining the other end of the stack, further comprising a first endplate disposed against the first module and a second endplate disposed against the last module.

3. The power inverter of claim 2 wherein the first endplate cooperates with the first module to define an outer coolant chamber.

4. The power inverter of claim 1 wherein the frame and power stage of each of the modules are arranged such that the frame is spaced apart from one of the minor sides of the power stage forming an opening between the frame and the minor side, and wherein the openings are aligned and cooperate to define a cavity extending along a length of the stack.

5. The power inverter of claim 4 further comprising a manifold received within the cavity and in fluid communication with each of the coolant chambers.

6. The power inverter of claim 5 wherein the manifold further includes an inlet chamber having a plurality of inlet ports in fluid communication with at least one of the coolant chambers, and an outlet chamber having a plurality of outlet ports in fluid communication with at least one of the coolant chambers.

7. The power inverter of claim 1 wherein the frame and power stage of each of the power modules are arranged such that each of the power modules further includes a first opening defined between the frame and the power stage and a second opening defined between the frame and the power stage, and wherein the first and second openings in each of the power modules are aligned and cooperate with first and second openings on adjacent power modules to define a pair of cavities extending along a length of the stack.

8. The power inverter of claim 7 further comprising an inlet manifold received in one of the cavities and an outlet manifold received in the other of the cavities.

9. The power inverter of claim 8 wherein the inlet manifold further includes a plurality of inlet ports in fluid communication with at least one of the coolant chambers and wherein the outlet manifold further includes a plurality of outlet ports in fluid communication with at least one of the coolant chambers.

10. The power inverter of claim 1 wherein the coolant chambers are arranged in a parallel flow configuration.

11. The power inverting of claim 1, wherein the switching unit includes a diode and a transistor.

12. A power inverter comprising:
a plurality of power modules each including a power stage having opposing major sides and minor sides surrounded by a frame, wherein the frame extends past the major sides and cooperates with the major sides to define pockets on each side of the power module, and wherein the modules are arranged in a stack such that pockets adjacent to each other cooperate to form coolant chambers interleaved with the modules, wherein the power stage of each of the power modules further includes at least one direct current terminal extending from one of the minor sides and projecting through an opening defined within the frame, and an alternating current terminal extending from another of the minor sides and projecting through an additional opening defined within the frame.

13. The power invert of claim 12, wherein each power stage has first and second switching units that are each electrically connected to the at least one direct current terminal and the alternating current terminal.

14. A power-module assembly comprising:
a plurality of power modules each including opposing major sides that each define a pocket recessed therein, the modules being arranged in a stack such that pockets adjacent to each other cooperate to form coolant chambers interleaved with the modules, wherein each power module further includes a power stage having first and second switching units that each have a transistor and a diode.

15. The assembly of claim 14 wherein the plurality of power modules further includes a first module defining one end of the stack and a last module defining the other end of the stack, further comprising a first endplate disposed against the first module and a second endplate disposed against the last module.

16. The assembly of claim 15 wherein the first endplate cooperates with the first module to define an outer coolant chamber.

17. The assembly of claim 14 wherein each of the power modules further include an opening, and wherein the openings are aligned and cooperate to define a cavity extending along a length of the stack.

18. The assembly of claim 17 further comprising a manifold received within the cavity and in fluid communication with each of the coolant chambers.

* * * * *